(12) United States Patent
Engelhardt et al.

(10) Patent No.: US 6,888,244 B2
(45) Date of Patent: May 3, 2005

(54) INTERCONNECT ARRANGEMENT AND METHOD FOR FABRICATING AN INTERCONNECT ARRANGEMENT

(75) Inventors: Manfred Engelhardt, Feldkirchen-Westerham (DE); Guenther Schindler, München (DE)

(73) Assignee: Infineon Technologies AG (DE)

(*) Notice: Subject to any disclaimer, the term of this patent is extended or adjusted under 35 U.S.C. 154(b) by 0 days.

(21) Appl. No.: 10/469,272

(22) PCT Filed: Mar. 1, 2002

(86) PCT No.: PCT/DE02/00758

§ 371 (c)(1),
(2), (4) Date: Jan. 7, 2004

(87) PCT Pub. No.: WO02/071483

PCT Pub. Date: Sep. 12, 2002

(65) Prior Publication Data

US 2004/0113274 A1 Jun. 17, 2004

(30) Foreign Application Priority Data

Mar. 1, 2001 (DE) .......................... 101 09 877

(51) Int. Cl.[7] .............................. H01L 23/48
(52) U.S. Cl. .................... 257/750; 257/751; 257/758; 257/759; 257/760
(58) Field of Search ................. 257/750, 751, 257/758, 759, 760; 438/622, 624

(56) References Cited

U.S. PATENT DOCUMENTS 5,759,913 A     6/1998   Fulford, Jr. et al.
6,130,151 A    10/2000   Lin et al.
6,452,272 B1 *  9/2002   Maas et al. ................. 257/750
6,624,063 B2 *  9/2003   Hasegawa et al. ........... 438/623

FOREIGN PATENT DOCUMENTS

EP        0 687 004         12/1995

OTHER PUBLICATIONS

Deposition, "Air gaps lower k of interconnect dielectrics", Ben Shieh, et al. Feb. 1999, Solid State Technology, pp. 51, 54, 58.
"Lowering of Intralevel Capacitance Using Air Gap Structures", J.G. Fleming, et al., Conference Proceedings ULSI XII Materials Research Society, pp. 471–477.
"A Novel Air Gap Integration Scheme for Multi–level Interconnects using Self–aligned Via Plugs", Tetsuya Ueda, et al., 1998 Symposium on VLSI Technology Digest of Technical Papers, 3 pgs.
Patent Abstracts of Japan, Publication No. 10116903, Publication Date May 6, 1998 (Abstract only), 3 pgs.
"Extended Abstracts", vol. 93–1, Spring Meeting, Honolulu, Hawaii, May 16–21, 1993, 2 pgs.
"Proceedings of the Symposium on Dry Process", Electronics and Dielectrics and Insulation Divisions, Proceedings vol. 88–7, The Electrochemical Society, Inc., 6 pgs.

* cited by examiner

Primary Examiner—Jasmine Clark
(74) Attorney, Agent, or Firm—Jeffrey R. Stone; Altera Law Group, LLC

(57) ABSTRACT

An interconnect arrangement (100) has a first layer (101), a first layer surface (102), thereon at least two interconnects (104) having a second layer surface (105) essentially parallel to the first layer surface (102), thereon a respective second layer (106) for each interconnect (104), the second layers (106) of adjacent interconnects covering regions between the adjacent interconnects (104), and thereon a third layer (107), which completely closes off the regions between the adjacent interconnects (104) by means of coverage.

22 Claims, 3 Drawing Sheets

INTERCONNECT ARRANGEMENT AND METHOD FOR FABRICATING AN INTERCONNECT ARRANGEMENT

BACKGROUND OF THE INVENTION

1. Field of the Invention

The invention relates to an interconnect arrangement and a method for fabricating an interconnect arrangement.

Integrated circuit arrangements are produced with an ever higher packing density. The consequence of this is that there is an ever smaller distance between interconnects in metallization planes. This means that there is a rise in capacitances which are formed between the interconnects and lead to high signal propagation times, a high power loss and crosstalk. To date, $SiO_2$ has principally been used as dielectric for insulation between the interconnects; its relative permittivity $\in_r=3.9$.

2. Description of the Related Prior Art

A number of methods for lowering the relative permittivity $\in_r$ and thus for lowering the capacitance between interconnects within an interconnect plane are known, for example from [1], [2], or [3].

In accordance with the cited prior art, cavities are produced between the interconnects within an interconnect plane. The insulating dielectric which determines the capacitance between the interconnects thus has a relative permittivity $\in_r$ which is almost equal to one. In this case, the interconnects themselves are enclosed by solid $SiO_2$ layers at the top and bottom for the purpose of insulation.

BRIEF SUMMARY OF THE INVENTION

Since the capacitances of the underlying and overlying insulating layers also contribute to a not inconsiderable extent to the total capacitance between adjacent interconnects within a layer and these insulating layers are still composed of solid $SiO_2$ material, the high relative permittivity $\in_r$ of these insulating layers has a considerable influence on the total capacitance between the adjacent interconnects.

When using a low-k material for the insulating layer above the interconnects, the cavities between adjacent interconnects are filled again owing to the low viscosity of the low-k material. This again results in a high relative permittivity $\in_r$ and thus a high total capacitance between adjacent interconnects.

Consequently, the invention is based on the problem of specifying an interconnect arrangement and also a method for fabricating an interconnect arrangement in which the cavities between the interconnects, irrespective of the material used for the insulating layer which covers the interconnects, occupy a largest possible space and a smallest possible capacitance is thus achieved between the interconnects on account of a small relative permittivity $\in_r$.

The problem is solved by means of an interconnect arrangement and also by means of a method for fabricating an interconnect arrangement having the features in accordance with the independent patent claims.

An interconnect arrangement has a first layer having a first layer surface, the first layer having a first insulation material, and at least two interconnects situated on the first layer surface, having a second layer surface essentially parallel to the first layer surface, the interconnects having a first material which is electrically conductive. Furthermore, the interconnect arrangement has a second layer made of a second insulation material, which second layer is produced on the second layer surface of each interconnect and projects beyond the interconnect, the second layers of adjacent interconnects covering regions between the adjacent interconnects. Finally, in the interconnect arrangement, a third layer covers the second layers, the third layer having a third insulation material and completely closing off the regions between the adjacent interconnects by means of coverage.

The interconnect arrangement can be designed in such a way that the third layer is also arranged in part in the regions between adjacent interconnects. However, in order to form a largest possible cavity between adjacent interconnects, an interconnect arrangement is preferred in which no part of the third layer is arranged in the regions between adjacent interconnects.

In a method for fabricating an interconnect arrangement, at least two interconnects are applied on a first layer surface of a first layer, the interconnects having a second layer surface essentially parallel to the first layer surface and sidewalls situated between the first layer surface and the second layer surface and also an electrically conductive first material and the first layer having a first insulation material. For each interconnect, a second layer made of a first insulation material is produced on the second layer surface, each second layer being arranged in such a way that the second layer projects beyond the interconnect and adjacent second layers are still not touched. Finally, a third layer made of a third insulation material is produced above the second layers, as a result of which an interconnect arrangement is formed between the first layer, the adjacent interconnects, the second layers and the third layer.

One advantage of the invention can be seen in the fact that, by means of the largest possible cavities as insulating layer between adjacent interconnects, the relative permittivity $\in_r$ of the insulating layer between the adjacent interconnects deviates only little from one and the capacitance between these interconnects is thus reduced. The interconnect arrangement enables a considerable reduction in the total capacitance within an integrated circuit. On account of leakage fields above and below the interconnect arrangement, the effective relative permittivity $\in_r$ for the entire interconnect arrangement is approximately two. In this case, the value of the effective relative permittivity $\in_r$ is dependent on the geometry of the entire interconnect arrangement.

A further advantage of the interconnect arrangement according to the invention is that the cavities between the interconnects do not have to be fabricated by means of a selective deposition of a layer of insulating material which covers the cavities. Consequently, there is also no need for time-consuming process optimization for such a selective deposition process. Primarily, the formation of menisci made of the insulating material in the region of the cavities is avoided on account of the invention.

Preferably, there is a cavity between the first layer, the adjacent interconnects, the second layers and the third layer, which cavity has an electrically insulating effect between the adjacent interconnects. This cavity, in which air, vacuum or an insulating gas, for example sulphur hexafluoride ($SF_6$), is present after completion of the interconnect arrangement, thus has a relative permittivity $\in_r$ of almost equal to one. The interconnect arrangement thus has a small capacitance effect.

In a preferred development of the interconnect arrangement according to the invention, at least one intermediate layer made of a second material is situated between the first layer and the interconnects. This intermediate layer may be provided for example in order to provide a barrier for necessary etching processes during the fabrication of the interconnect arrangement, in order that the first layer, usually having silicon dioxide ($SiO_2$), is not damaged.

The third insulation material is preferably a low-k material having a relative permittivity $\in_r$ in the range between 1 and 4. Since the third layer, which completely covers the interconnect arrangement and effects insulating screening in the vertical direction with respect to the first layer surface, also makes a contribution to the total capacitance between adjacent interconnects, care should be taken to ensure that the third insulation material used for the third layer also has a low relative permittivity $\in_r$.

In a preferred development of the interconnect arrangement according to the invention, the third insulation material is a low-k material having a relative permittivity $\in_r$ in the range between 1.5 and 3.

The second insulation material and/or the third insulation material of the interconnect arrangement preferably have silicon dioxide ($SiO_2$). As an alternative, the second insulation material and/or the third insulation material may also have silicon nitride ($Si_3N_4$) or an organic material. Furthermore, a silicon-based oxide-nitride may also be used as second insulation material and/or as third insulation material. In order to obtain a low relative permittivity $\in_r$ when using these insulation materials, the respective insulation material should be applied in porous form. When using organic material, polymers are preferably applied in a methane environment during a PECVD process (PECVD= plasma enhanced chemical vapour deposition).

In a preferred development of the interconnect arrangement according to the invention, the first layer has at least two partial layers arranged one above the other, the upper partial layer being patterned in accordance with the regions between the interconnects in such a way that the upper partial layer is arranged below the interconnects and is at least partly absent below the regions between the interconnects. Consequently, between adjacent interconnects, trenches are formed in the insulating first layer. This arrangement has the advantage that the interconnects are not applied directly on an insulation layer which connects the interconnects over the shortest route. An insulation layer which connects the interconnects over the shortest route promotes electrical leakage fields between adjacent interconnects. This results in an unsatisfactory value for the effective relative permittivity $\in_r$ and thus for the total capacitance between adjacent interconnects. A patterned upper partial layer makes it possible to enlarge the connecting route between adjacent interconnects and thus to further reduce the effective relative permittivity $\in_r$. A patterned upper partial layer thus enables a further reduction in the total capacitance between adjacent interconnects.

If the two partial layers have the same insulation material, an etching stop layer made of a third material is preferably situated between the upper partial layer and the lower partial layer. In this case, the third material is preferably essentially resistant to etchant which acts on the first insulation material. Consequently, the patterning of the upper partial layer can be fabricated by etching the upper partial layer with the interconnects as mask. The etching is ended when the etching stop layer is uncovered below the regions between adjacent interconnects. Consequently, the depth of the trenches between adjacent interconnects can be set by means of the thickness of the upper partial layer.

In a method for fabricating an interconnect arrangement, before the application of the interconnects on the first layer surface, preferably at least one intermediate layer made of a second material is produced on the first layer surface. The intermediate layer is provided as a barrier for etching processes during the fabrication of the interconnect arrangement, in order that the first layer, usually having silicon dioxide ($SiO_2$) is not damaged. If an oxygen compound is chosen as first insulation material for the first layer, then a nitrogen compound, for example a titanium-nitrogen compound, is preferably used as second material for the intermediate layer. If a titanium-nitrogen compound is used, the intermediate layer must also be removed on regions of the first layer surface which are not covered by the interconnects. This is usually achieved by means of an etching process, the interconnects serving as mask for the intermediate layer. When using a nitrogen compound as first insulation material for the first layer, an oxygen compound is preferred as second material for the intermediate layer. If the same material is used for the intermediate layer and also for the subsequently fabricated spacers, then a thin, further intermediate layer made of a different material is preferably provided directly above the intermediate layer.

Preferably, trenches which reach at least partly into the first layer are produced between adjacent interconnects. This lengthens the connecting route between adjacent interconnects and reduces the production of electrical leakage fields which adversely affect the total capacitance.

The first layer is preferably produced from an upper partial layer, an etching stop layer and a lower partial layer. The trenches between adjacent interconnects are then produced by the fact that, using the interconnects as mask, the upper partial layer is removed below the regions between adjacent interconnects. The etching stop layer is uncovered in the process. If silicon dioxide ($SiO_2$) is chosen as first insulation material for the first layer and thus for the upper partial layer and also for the lower partial layer, then silicon nitride ($Si_3N_4$), for example, can be used for the etching stop layer.

In a preferred development of the method according to the invention, spacers are produced on the sidewalls of the interconnects, the spacers having a spacer material and being arranged in such a way that spacers of adjacent interconnects still do not touch one another. In this case, the spacers serve as auxiliary supports for the fabrication of the second layers, which project beyond the interconnects. The spacer material used is preferably silicon nitride ($Si_3N_4$) which is applied conformally to the sidewalls of the interconnects. As an alternative, it is also possible to use another spacer material which can be applied conformally and etched selectively with respect to the second layers and also with respect to the first layer.

In a preferred embodiment of the method according to the invention, the spacers are produced on the sidewalls of the interconnects by means of a conformal deposition of spacer material and selective and anisotropic etching of the spacer material. Firstly, spacer material is deposited conformally over the interconnects and over regions of the first layer surface which are not covered by the interconnects. The spacer material is subsequently etched anisotropically and selectively parallel to the second layer surface. This enables targeted fabrication and setting of the form of the spacers. The thickness of the deposited spacer material is preferably set in such a way that the remaining gap between two adjacent interconnects is only just not closed. Consequently, a thin air gap remains between the adjacent interconnects or the spacers situated on the sidewalls thereof.

In the method according to the invention, the spacers are preferably removed again below the second layers. Since the spacers only serve as auxiliary supports for the fabrication of the second layers and would obstruct formation of the largest possible cavities between the interconnects, the spacers are removed again after the fabrication of the second layers.

The second layers are preferably produced by means of a non-conformal method essentially parallel to the first layer surface above the second layer surface and the spacers. To that end, the second insulation material of the second layers is deposited by means of a CVD process (CVD=chemical vapour deposition) with the smallest possible edge coverage principally on the interconnects which are widened by the spacers. To that end, the CVD process is operated in the diffusion-determined regime, preferably by means of increasing the pressure. Instead of using a CVD process, it is also possible to fabricate the second insulation material for fabricating the second layers by means of a sputtering process. A second insulation material that has possibly penetrated deeply into the air gaps can be removed again with the aid of a short isotropic etching, for example wet-chemically or else in dry fashion in a downstream etching process. Such a downstream etching process is described in [4].

In a preferred embodiment of the method according to the invention, the spacer material of the spacers is etched away after the production of the second layers, a selective etching process being employed. In this case, the selective etching process is preferably isotropic. In this case, the air gap situated between adjacent spacers is necessary for the removal of the spacers in order to offer the etchant an area of attack on the spacers. Possible etching processes are, for example, a wet-chemical etching process or a downstream dry-etching process, described in [5] for a silicon dioxide ($SiO_2$), with high selectivity.

The third layer is preferably produced in such a way that firstly third insulation material is deposited by means of a non-conformal method over the second layers until cavities have formed between the first layer, the adjacent interconnects, the second layers and the third layer. Afterwards, third insulation material is deposited by means of a conformal standard method. During the non-conformal method, hardly any third insulation material penetrates into the resulting cavities owing to the second layers acting in a screen-like manner. As a result, the sidewalls of the interconnects are covered with third insulation material only to a very small extent, as a result of which the relative permittivity $\in_r$ of the entire interconnect arrangement is influenced only to an insignificant extent. In the case of relatively small feature sizes such as, for example, of a very large scale integrated circuit (VLSI circuit=very large scale integration), it is not possible to ascertain any coverage of the sidewalls of the interconnects with third insulation material.

BRIEF DESCRIPTION OF THE DRAWINGS

Exemplary embodiments of the invention are illustrated in the figures and are explained in more detail below. In this case, identical reference symbols designate identical components.

In the figures.

DETAILED DESCRIPTION OF THE INVENTION

Figure 1:
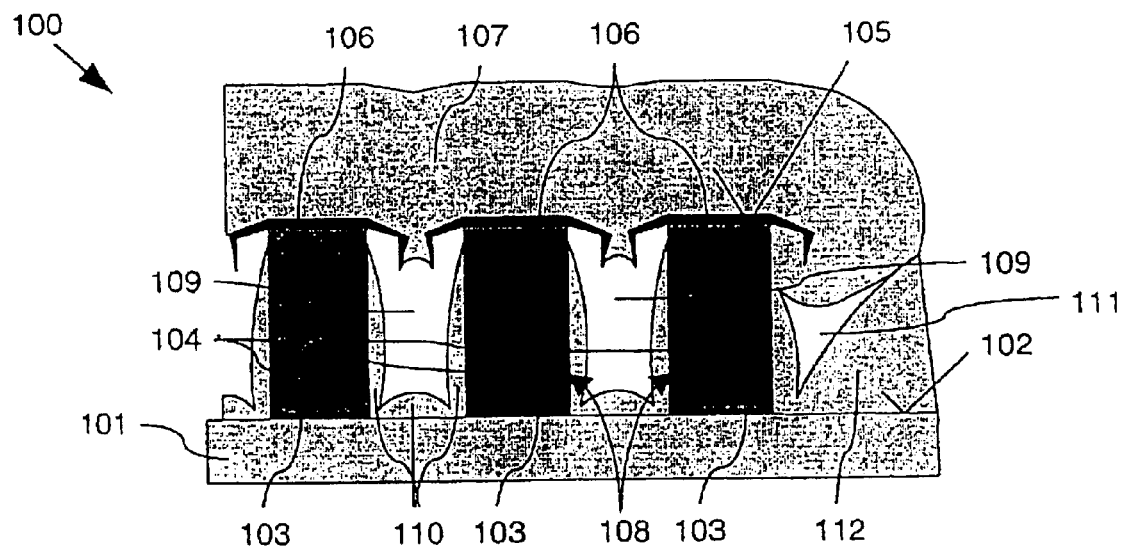
FIG. 1 shows a cross section through an interconnect arrangement in accordance with a first exemplary embodiment of the invention.

FIG. 1 shows a cross section through an interconnect arrangement 100 in accordance with a first exemplary embodiment of the invention.

The interconnect arrangement 100 has a substrate having a substrate surface formed as first layer surface 102 as first layer 101. An insulating material, silicon dioxide ($SiO_2$) in accordance with this exemplary embodiment, is chosen as substrate material.

Situated on the first layer surface 102 are interconnects 104 made of aluminium or copper with a respective intermediate layer 103 made of a titanium-nitrogen compound between the first layer surface 102 and the interconnects 104. The interconnects 104 are bounded by a second layer surface 105 arranged parallel to the first layer surface 102 and also sidewalls 108 which connect the first layer surface 102 and the second layer surface 105.

Situated on the second layer surface 105 of each interconnect 104 is a second layer 106 made of silicon dioxide ($SiO_2$), which projects beyond the respective interconnect 104. In this exemplary embodiment of the invention, the second layers 106 have the form of screens covering the interconnects 104. In this case, the second layers 106 cover regions between adjacent interconnects 104. Since the second layers 106 of adjacent interconnects 104 do not touch one another, the regions between the adjacent interconnects 104 are not completely closed off by the second layers 106.

A third layer 107 made of silicon dioxide ($SiO_2$) covers the second layers 106 and thus completely closes off the regions between the adjacent interconnects 104. Consequently, cavities 109 enclosed by the first layer surface 102, the sidewalls 108 of the interconnects 104, the second layers 106 and the third layer 107 are situated between adjacent interconnects 104.

During the fabrication of the third layer 107, silicon dioxide ($SiO_2$) was able to penetrate into the incompletely closed-off regions between the adjacent interconnects 104. This caused a thin covering 110 of the sidewalls 108 of the interconnects 104 and also of that part of the first layer surface 102 not covered by the interconnects 104 with silicon dioxide ($SiO_2$). The smaller the distance between adjacent second layers 106, the smaller the covering 110 of the sidewalls 108 of the interconnects 104 and also of that part of the first layer surface 102 not covered by the interconnects 104. In another exemplary embodiment of the invention (not illustrated in the figures), the second layers 106 can also be fabricated with such a small spacing that no covering 110 whatsoever is produced.

At the end of the interconnect arrangement 100, the last interconnect 104 has an adjacent interconnect 104 only on one side. On the side without an adjacent interconnect 104, the last interconnect 104 requires electrical insulation from the environment. In this case, it is possible to dispense with a low relative permittivity $\in_r$ for lack of a further electrically conductive element representing a capacitance. Consequently, the last interconnect 104 is not electrically insulated by means of a cavity 109 like between adjacent interconnects 104, but by means of a terminating cavity 111 and a terminating insulating layer 112.

The distance between adjacent interconnects 104 and the thickness of the interconnects 104 should preferably be chosen in such a way that the interconnect arrangement 100 has a sufficiently good carrying capability for further layers and metallization planes arranged above the interconnect arrangement 100. In accordance with this exemplary embodiment, the interconnects 104 each have a width which is almost equal to the distance between adjacent interconnects 104. In accordance with this exemplary embodiment, the interconnects 104 have a height corresponding to twice the width of the interconnects 104.

As an alternative, it is also possible to choose other dimensions for the width, the height and/or the spacings of the interconnects 104.

A method for forming the interconnect arrangement 100 in accordance with the first exemplary embodiment of the invention is described step by step below.

Figure 2:
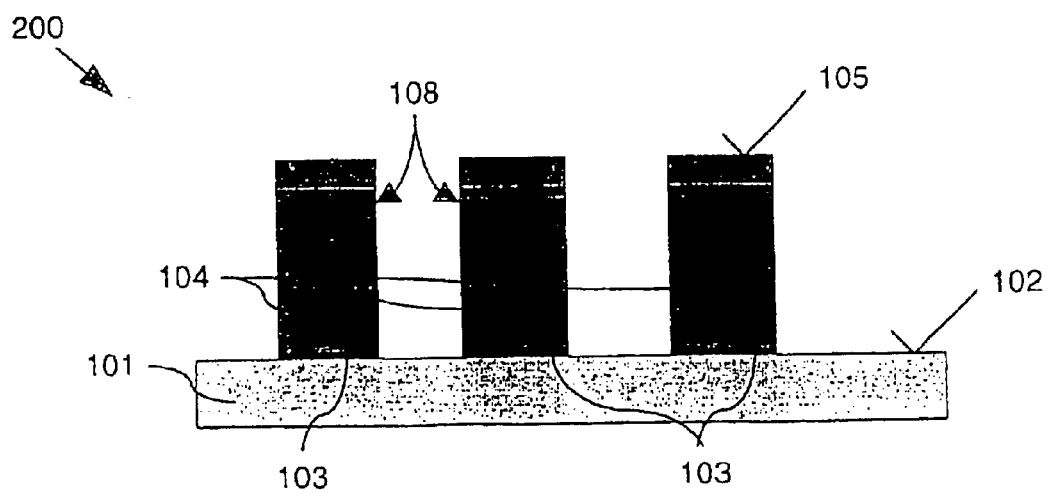
FIG. 2 shows a cross section through an as yet not completed interconnect arrangement in accordance with FIG. 1 at a first time during the performance of the fabrication method in accordance with the first exemplary embodiment of the invention.

FIG. 2 shows a cross section through an as yet not completed interconnect arrangement 200 at a first time during the performance of the fabrication method in accordance with the first exemplary embodiment of the invention.

A substrate having a substrate surface formed as first layer surface 102 is used as first layer 101. The substrate material is silicon dioxide (SiO$_2$). An intermediate layer 103 made of a titanium-nitrogen compound is applied over the area of the first layer surface 102 using a conventional standard method. If the interconnect material is aluminium, the intermediate layer 103 serves as adhesion layer for the interconnects 104 on the first layer 101, and if the interconnect material is copper, the said intermediate layer serves as a barrier against copper diffusion in order to protect the first layer 101. If the interconnect material is copper, the intermediate layer 103 may also have tantalum or a tantalum-nitrogen compound.

A plurality of interconnects 104 made of aluminium or copper are formed above the intermediate layer 103 using known subtractive methods. The interconnects 104 terminate with a second layer surface 105 parallel to the first layer surface 102 and have sidewalls 108 which connect the second layer surface 105 and the first layer surface 102.

During the fabrication of interconnects 104 made of copper, the so-called damascene technique may preferably be employed: firstly an auxiliary layer made of silicon dioxide (SiO$_2$) is applied on the area of the first layer surface 102 covered by the intermediate layer 103. In this case, the thickness of this auxiliary layer is set in accordance with the desired height for the interconnects 104 to be fabricated. Using customary lithography and etching techniques, trenches are etched into the said auxiliary layer at the locations at which the interconnects 104 are intended to be formed. These trenches have the desired width and the desired distance from one another in accordance with the interconnects 104 to be fabricated and reach down to the intermediate layer 103.

A barrier layer made, for example, of a tantalum-nitrogen compound and then copper are then deposited over the auxiliary layer with the trenches by means of customary metallization methods, the trenches being overfilled. In order to fabricate the second layer surface 105 parallel to the first layer surface 102, the copper overfilling the trenches and also the barrier layer are removed areally by means of chemical mechanical polishing. Finally, the auxiliary layer made of silicon dioxide (SiO$_2$) is removed selectively with respect to copper by means of etching until the intermediate layer 103 is reached. The intermediate layer 103 made of a titanium-nitrogen compound acts as an etching stop layer in this case. The interconnects 104 formed on the first layer surface 102 and the intermediate layer 103 remain.

The process for fabricating the interconnects 104 also includes the final etching of the intermediate layer 103 at all the locations which are not covered by the interconnects 104. In this case, the interconnects 104 serve as mask for the final etching. As a result, the first layer surface 102 is uncovered again between the interconnects 104. Consequently, the intermediate layer 103 is now situated exclusively between the interconnects 104 and the first layer surface 102.

Figure 3:
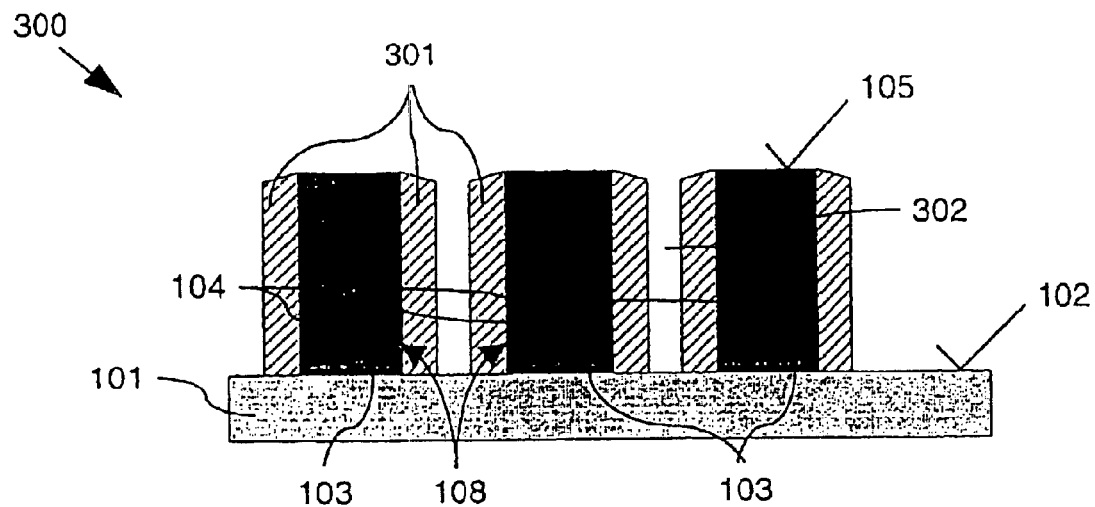
FIG. 3 shows a cross section through an as yet not completed interconnect arrangement in accordance with FIG. 1 at a second time during the performance of the fabrication method in accordance with the first exemplary embodiment of the invention.

FIG. 3 shows a cross section through an as yet not completed cavity structure 300 at a second time during the performance of the fabrication method in accordance with the first exemplary embodiment of the invention.

Spacers 301 made of silicon nitride (Si$_3$N$_4$) are produced on the sidewalls 108 of the interconnects 104 conformally by means of conformal deposition and subsequent etching, the spacers 301 being arranged in such a way that spacers 301 of adjacent interconnects 104 still do not touch one another. In this case, the spacers 301 serve as auxiliary supports for the subsequent fabrication of the second layers 106 which project beyond the interconnects 104.

The selective and anisotropic etching of the conformally deposited spacer material enables targeted fabrication and setting of the form of the spacers 301. The thickness of the deposited spacer material is preferably set in such a way that the remaining gap between two adjacent interconnects 104 is only just not closed. Consequently, a thin air gap 302 remains between the adjacent interconnects 104 or the spacers 301 situated on the sidewalls 108 thereof.

Figure 4:
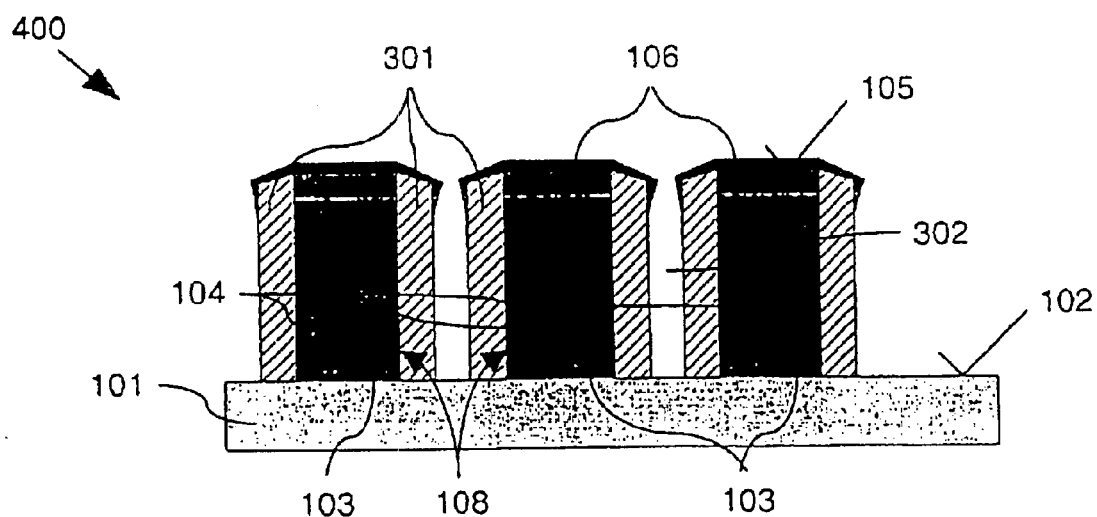
FIG. 4 shows a cross section through an as yet not completed interconnect arrangement in accordance with FIG. 1 at a third time during the performance of the fabrication method in accordance with the first exemplary embodiment of the invention.

FIG. 4 shows a cross section through an as yet not completed interconnect arrangement 400 at a third time during the performance of the fabrication method in accordance with the first exemplary embodiment of the invention.

The second layers 106 made of silicon dioxide (SiO$_2$) are produced by a non-conformal method essentially parallel to the first layer surface 102 above the second layer surface 105 and the spacers 301. To that end, the silicon dioxide (SiO$_2$) is deposited by means of a CVD process with as little edge coverage as possible principally on the interconnects 104 widened by the spacers 301. To that end, the CVD process is operated in the diffusion-determined regime by means of increasing the pressure. Silicon dioxide (SiO$_2$) that has possibly penetrated deeply into the air gaps 302 is removed again by means of a short isotropic etching in a downstream etching process.

Figure 5:
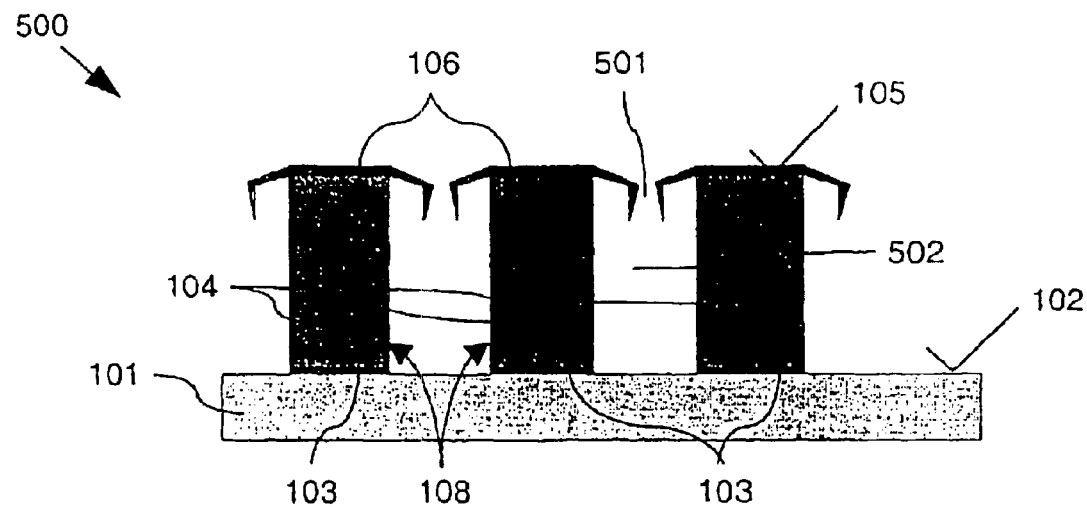
FIG. 5 shows a cross section through an as yet not completed interconnect arrangement in accordance with FIG. 1 at a fourth time during the performance of the fabrication method in accordance with the first exemplary embodiment of the invention.

FIG. 5 shows a cross section through an as yet not completed interconnect arrangement 500 at a fourth time during the performance of the fabrication method in accordance with the first exemplary embodiment of the invention.

Since the spacers 301 clearly essentially serve as auxiliary supports for the fabrication of the second layers 106 and obstruct formation of the largest possible cavities 109 between the interconnects 104, the spacers 301 are removed again after the fabrication of the second layers 106. To that end, the silicon nitride ($Si_3N_4$) of the spacers 301 is etched away after the production of the second layers 106, a selective, isotropic etching process being employed. In this case, the air gap 302 situated between adjacent spacers 301 is necessary for the removal of the spacers 301 in order to offer the etchant an area of attack in the spacers 301.

The largest possible interspaces 502 are now situated between the sidewalls 108 of adjacent interconnects 104, the first layer surface 102 and the second layers 106. On account of the distance between them, respectively adjacent second layers 106 form openings 501 for the interspaces 502, as a result of which the interspaces 502 are not completely closed off.

In order to form cavities 109 from the interspaces 502, the openings 501 must now be closed. Therefore, the third layer 107 is produced in two separate method steps. Firstly, silicon dioxide ($SiO_2$) is deposited by means of a non-conformal method over the second layers 106 until the openings 501 are closed and cavities 109 have formed between the first layer 101, the adjacent interconnects 104, the second layers 106 and the third layer 107. Afterwards, silicon dioxide ($SiO_2$) is deposited by means of a conformal standard method in order to form a thick insulating third layer 107, as is illustrated in FIG. 1.

During the non-conformal method, hardly any silicon dioxide ($SiO_2$) penetrates into the resulting cavities 109 owing to the second layers 106 acting in a screen-like manner. As a result, only a very small covering 110 of the sidewalls 108 of the interconnects 104 with silicon dioxide ($SiO_2$) is produced, as a result of which the relative permittivity $\in_r$ of the entire interconnect arrangement 100 is influenced only to an insignificant extent.

The interconnect arrangement 100, and thus also a last interconnect 104 without an adjacent interconnect 104 beside one of its two sidewalls 108, requires electrical insulation from the environment. Therefore, the third layer 107 is formed above the entire interconnect arrangement 100. Since the last interconnect 104 has an adjacent interconnect 104 only beside one of its two sidewalls 108, the last interconnect 104 is not electrically insulated by means of a cavity 109 like between adjacent interconnects 104 but by means of a terminating cavity 111 and a terminating insulation layer 112. In this case, the terminating insulation layer 112 is produced as a side effect during the production of the third layer 107 and thus likewise has silicon dioxide ($SiO_2$).

Figure 6:
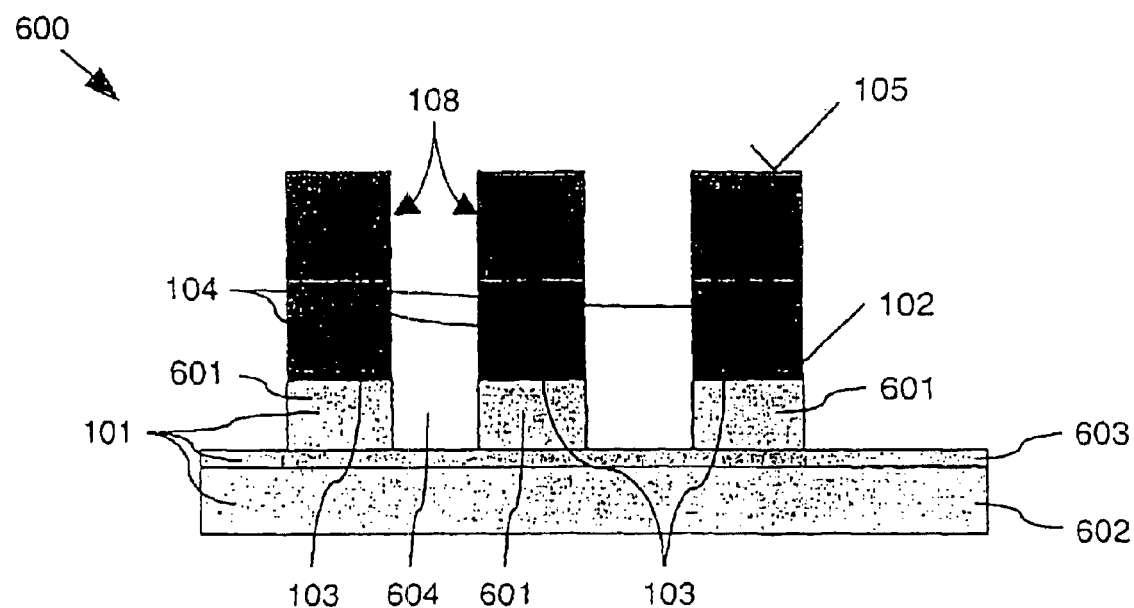
FIG. 6 shows a cross section through an as yet not completed interconnect arrangement at a first time during the performance of the fabrication method in accordance with a second exemplary embodiment of the invention.

FIG. 6 shows a cross section through an as yet not completed interconnect arrangement 600 at a first time during the performance of the fabrication method in accordance with a second exemplary embodiment of the invention.

The as yet not completed interconnect arrangement 600 of the second exemplary embodiment differs from the as yet not completed interconnect arrangement 200 of the first exemplary embodiment only in the different structure of the first layer 101.

In accordance with this exemplary embodiment, the first layer 101 has an upper partial layer 601 made of silicon dioxide ($SiO_2$), an etching stop layer 602 made of silicon nitride ($Si_3N_4$) and a lower partial layer 603 made of silicon dioxide ($SiO_2$). However, the first layer 101 may also be composed of layers with different insulation materials. If different insulation materials with a different behaviour during an etching process are used for the upper partial layer 601 and the lower partial layer 603, it is possible to dispense with the etching stop layer 602.

The upper partial layer 601 is patterned in such a way that it is arranged below the interconnects 104 and is missing below the regions between the interconnects 104. Situated in the upper partial layer 601 are trenches 604 which reach down with uniform width between the interconnects 104 from the second layer surface 105 as far as the etching stop layer 602.

The upper partial layer 601 can be patterned as follows: firstly, the silicon dioxide ($SiO_2$) for the upper partial layer 601 is deposited areally. Afterwards, the interconnects 104 are fabricated, as already explained in the description with respect to FIG. 2. The trenches 604 are subsequently etched into the areally deposited insulation material, the interconnects being used as an etching mask. In this case, by way of example, a wet-chemical downstream etching process may be employed. In the selection of the etching process to be employed, care should be taken to ensure that the etchant preferably acts on the silicon dioxide ($SiO_2$), and not on the interconnect material. The etching process is ended as soon as the etching stop layer 602 is uncovered.

In accordance with this exemplary embodiment, the trenches 604 have a depth which preferably corresponds to 0.5 to 2 times the width of the interconnects 104.

The further fabrication steps for an interconnect arrangement in accordance with the second exemplary embodiment correspond to the fabrication steps described above for the first exemplary embodiment. The interconnect arrangement in accordance with the second exemplary embodiment thus essentially corresponds to the interconnect arrangement 100 in accordance with the first exemplary embodiment. The two exemplary embodiments differ merely in the construction of the first layer 101. Thus, the cavities 109 in the second exemplary embodiment have, compared with the first exemplary embodiment, a larger volume owing to the existence of the trenches 604.

To form an interconnect arrangement according to the invention in accordance with the first or second exemplary embodiment, instead of the chosen insulation materials and the fabrication processes thereof, it is also possible to use other insulating materials and fabrication processes.

By way of example, what are suitable as third insulation material for the third layer 107 are insulating low-k materials having a low relative permittivity $\in_r$ which are applied in a spin-on process and have a low viscosity. In a spin-on process, the usually liquid material to be applied is applied to the areas to be coated during spin-coating by means of spin-on.

If a low-k material having high viscosity is used as third insulation material and, as a result, no third insulation material penetrates through the openings 501 into the interspaces 502, and so no covering 110 is thus produced, the low-k material can be used directly to terminate the cavities 109 and thus to form the third layer 107. Otherwise, firstly silicon dioxide ($SiO_2$) for terminating the cavities 109 is deposited non-conformally over the openings 501 and only then is the low-k material deposited as third layer 107.

What is claimed is:

1. Interconnect arrangement, comprising:
   a first layer and a first layer surface, the first layer having a first insulation material;
   at least two interconnects situated on the first layer surface, having a second layer surface essentially parallel to the first layer surface, the interconnects having a first material which is electrically conductive;

a second layer made of a second insulation material, which second layer is produced on the second layer surface of each interconnect and projects beyond the interconnect, the second layers of adjacent interconnects covering regions between the adjacent interconnects;

a third layer covering the second layers, the third layer having a third insulation material and completely closing off the regions between the adjacent interconnects by means of coverage; and a cavity between the first layer, the adjacent interconnects, the second layers and the third layer, the cavity having an electrically insulating effect between the adjacent interconnects.

2. Interconnect arrangement according to claim 1, further comprising the third layer being arranged in part in the regions between adjacent interconnects.

3. Interconnect arrangement according to claim 1, further comprising a cavity between the first layer, the adjacent interconnects, the second layers and the third layer, the cavity having an electrically insulating effect between the adjacent interconnects.

4. Interconnect arrangement according to claim 1, in which at least one intermediate layer made of a second material is situated between the first layer and the interconnects.

5. Interconnect arrangement according to claim 1, in which the third insulation material is a low-k material having a relative permittivity $\in_r$ in the range between 1 and 4.

6. Interconnect arrangement according to claim 1, in which the third insulation material is a low-k material having a relative permittivity $\in_r$ in the range between 1.5 and 3.

7. Interconnect arrangement according to claim 1, in which the second insulation material and the third insulation material have silicon dioxide.

8. Interconnect arrangement according to claim 1, in which the second insulation material and the third insulation material have silicon nitride.

9. Interconnect arrangement according to claim 1, in which the second insulation material and the third insulation material have an organic material.

10. Interconnect arrangement according to claim 1, in which the first layer has at least two partial layers arranged one above the other, the upper partial layer being patterned in accordance with the regions between the interconnects in such a way that the upper partial layer is arranged below the interconnects and is at least partly absent below the regions between the interconnects.

11. Interconnect arrangement according to claim 10, in which the two partial layers have the same first insulation material and an etching stop layer made of a third material is situated between the upper partial layer and the lower partial layer, the third material essentially being resistant to the etchant acting on the first insulation material.

12. Method for fabricating an interconnect arrangement, comprising:

applying at least two interconnects on a first layer surface of a first layer, the interconnects having a second layer surface essentially parallel to the first layer surface and sidewalls situated between the first layer surface and the second layer surface and also an electrically conductive first material and the first layer having a first insulation material;

producing, for each interconnect, a second layer made of a first insulation material on the second layer surface, each second layer being arranged in such a way that the second layer projects beyond the interconnect and adjacent second layers are still not touched; and producing a third layer made of a third insulation material above the second layers, as a result of which an Interconnect arrangement is formed between the first layer, the adjacent interconnects, the second layer and the third layer.

13. Method according to claim 12, further comprising producing at least one intermediate layer made of a second material on the first layer surface, before applying the at least two interconnects on the first layer surface.

14. Method according to claim 12, further comprising producing trenches which reach at least partly into the first layer between adjacent interconnects.

15. Method according to claim 14, further comprising:

producing the first layer from an upper partial layer, an etching stop layer and a lower partial layer;

producing the trenches between adjacent interconnects using the interconnects as a mask;

removing the upper partial layer below the regions between adjacent interconnects; and uncovering the etching stop layer.

16. Method according to claim 12, further comprising producing spacers on the sidewalls of the interconnects, the spacers having a spacer material and being arranged in such a way that spacers of adjacent interconnects still do not touch one another.

17. Method according to claim 16, further comprising:

firstly depositing conformally, the spacer material; and etching the spacer material anisotropically and selectively parallel to the first layer surface.

18. Method according to claim 16, further comprising removing the spacers again below the second layers.

19. Method according to claim 16, further comprising producing the second layers by means of a non-conformal method essentially parallel to the first layer surface above the second layer surface and the spacers.

20. Method according to claim 16, further comprising etching away the spacer material of the spacers after the production of the second layers, by use of a selective etching process.

21. Method according to claim 20, in which the selective etching process is isotropic.

22. Method according to one of claims 12 to 21, further comprising producing the third layer in such a way that firstly third insulation material is deposited by means of a non-conformal method over the second layers until cavities have formed between the first layer, the adjacent interconnects, the second layers and the third layer, and third insulation material is subsequently deposited by means of a conformal standard method.

* * * * *

UNITED STATES PATENT AND TRADEMARK OFFICE
CERTIFICATE OF CORRECTION

PATENT NO. : 6,888,244 B2
DATED : May 3, 2005
INVENTOR(S) : Engelhardt et al.

It is certified that error appears in the above-identified patent and that said Letters Patent is hereby corrected as shown below:

Title page,
Item [30], Foreign Application Priority Data, after "101 09 877" add -- .4 --.

Column 9,
Line 61, after "silicon", delete ".".

Signed and Sealed this

Twenty-fourth Day of January, 2006

JON W. DUDAS
*Director of the United States Patent and Trademark Office*